United States Patent
Yeh

(10) Patent No.: US 8,500,477 B2
(45) Date of Patent: Aug. 6, 2013

(54) INDIVIDUAL LOADING MECHANISM WITH SIMPLIFIED LOCKING ARRANGEMENT

(75) Inventor: Cheng-Chi Yeh, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/283,618

(22) Filed: Oct. 28, 2011

(65) Prior Publication Data

US 2012/0289075 A1 Nov. 15, 2012

(30) Foreign Application Priority Data

May 10, 2011 (TW) .................................. 100208284

(51) Int. Cl.
*H01R 13/625* (2006.01)

(52) U.S. Cl.
USPC ........................................................ 439/342

(58) Field of Classification Search
USPC .................. 439/331, 330, 564, 573, 342, 345
See application file for complete search history.

(56) References Cited

U.S. PATENT DOCUMENTS

| | | | |
|---|---|---|---|
| 6,244,875 B1 * | 6/2001 | McHugh et al. ................. | 439/73 |
| 6,485,320 B1 * | 11/2002 | Ma .................................. | 439/342 |
| 7,070,436 B2 * | 7/2006 | Chin .............................. | 439/342 |
| 7,210,952 B2 * | 5/2007 | Ishida ........................... | 439/331 |
| 7,234,955 B1 * | 6/2007 | Ho .................................. | 439/331 |
| 7,438,580 B1 * | 10/2008 | Aoki et al. ..................... | 439/331 |
| 7,473,121 B2 * | 1/2009 | Fan et al. ....................... | 439/342 |
| 7,628,634 B2 * | 12/2009 | Yeh et al. ...................... | 439/331 |
| 7,736,168 B2 * | 6/2010 | Yeh et al. ...................... | 439/331 |
| 7,753,706 B2 * | 7/2010 | Liu et al. ....................... | 439/331 |
| 7,794,261 B2 * | 9/2010 | Terhune et al. ............... | 439/331 |
| 7,845,964 B2 * | 12/2010 | Fan ................................ | 439/331 |
| 2008/0124955 A1 * | 5/2008 | Szu ................................ | 439/78 |
| 2009/0264005 A1 * | 10/2009 | Yeh et al. ...................... | 439/331 |

\* cited by examiner

*Primary Examiner* — Alexander Gilman
(74) *Attorney, Agent, or Firm* — Wei Te Chung; Ming Chieh Chang

(57) ABSTRACT

An electrical connector assembly includes a printed circuit board, a socket connector assembled on the printed circuit board and a chip module seating on the insulative socket. The socket connector assembly has an insulating socket having a plurality of terminals received therein, a cover located on the insulating housing and three retention members secured to the printed circuit board and mating with the cover. The cover is attached to two of the retention members and capable of linear and rotational movements with regarding to said retention members so that the cover presses the chip module and is secured by another retention member.

20 Claims, 6 Drawing Sheets

US 8,500,477 B2

INDIVIDUAL LOADING MECHANISM WITH SIMPLIFIED LOCKING ARRANGEMENT

BACKGROUND OF THE INVENTION

1. Field of the Invention

The present invention relates to an individual loading mechanism (ILM), and more particularly an ILM with simplified locking mechanism facilitating reliable maneuver so as to press a CPU chip toward a socket connector mounted onto a printed circuit board.

2. Description of the Prior Art

An electrical connector electrically connecting a chip module to a printed circuit board is described in U.S. Pat. No. 7,628,634, issued to Yeh on Dec. 8, 2009. The electrical connector includes a socket body with a plurality of electrical contacts secured thereon, a metal load plate covering the socket body, a retention frame for securing the load plate on the printed circuit board, and a back plate. A fastener such as a first bolt is provided to engage with the load plate and fasten the load plate on the printed circuit board. The load plate is connected with and supported by the retention frame. The load plate includes a frame and a tongue at a first side of the frame. The tongue has a first section bending from the frame and a second section extending outwardly from the first section. A hole is defined on the second section of the tongue. The first bolt extends through the holes and engages with the screw hole of the back plate. The load plate has a pair of hooks bending downwardly for projecting into the recesses for clasping the retention frame at a second side thereof The load plate rotates towards or away from the socket body from an open position to a closed position.

The electrical connector needs the retention frame for securing the load plate on the printed circuit board. The retention frame is mounted to the printed circuit board at first and then the load plate is assembled to the retention frame. The assembly of the electrical connector is complicated. It is also takes much more room and can't keep up with the trend of the electrical connector.

Therefore, it is needed to find a new electrical socket to overcome the problems mentioned above.

SUMMARY OF THE INVENTION

Accordingly, an object of the present invention is to provide an ILM with simplified locking mechanism so as to efficiently press a CPU chip toward a socket connector mounted onto a printed circuit board.

In order to achieve the object set forth, an electrical connector assembly comprises a printed circuit board and a socket connector assembled on the printed circuit board. The socket connector comprises an insulating housing having a plurality of terminals received therein and a cover mounted to the printed circuit board and located above the insulating housing. One of the cover and the printed circuit board has a post, and the other has a hole engaging with the post. The hole includes a through hole and a retention hole communicated with one side of the through hole. The post can pass through the through hole and enter into the retention hole when the cover slides relative to the printed circuit board along a horizontal direction, so as to fasten one side of the cover to the printed circuit board.

DESCRIPTION OF PREFERRED EMBODIMENT

Figure 1:
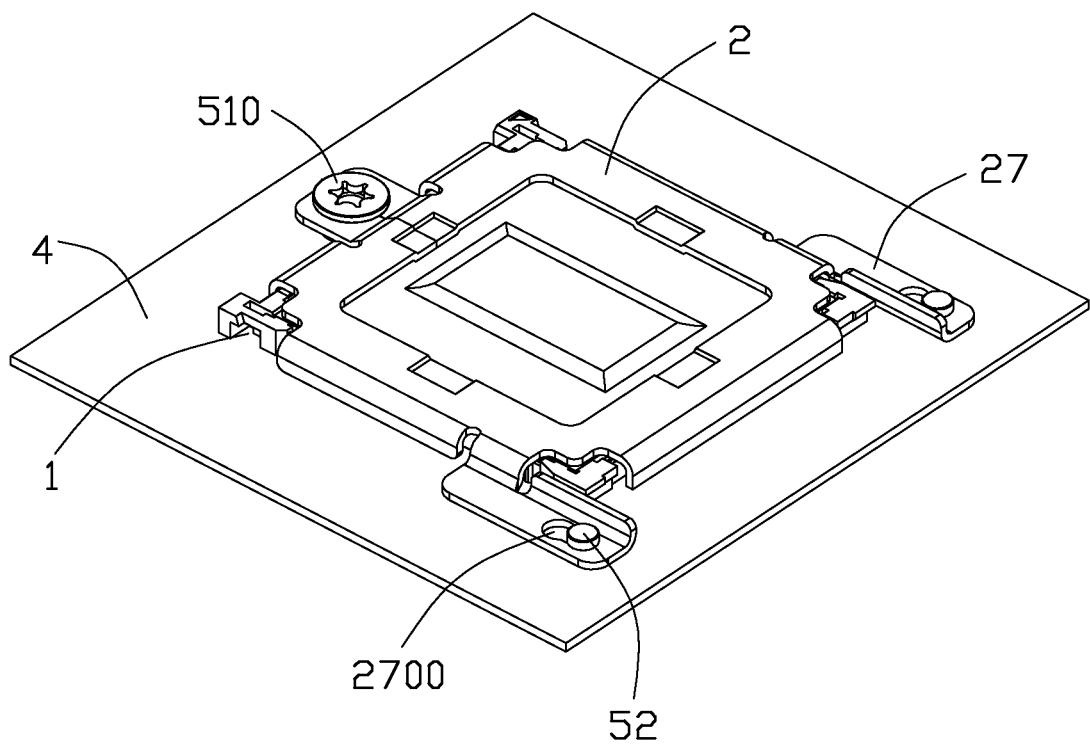
FIG. 1 is an isometric, assembled view of an electrical connector assembly in accordance with a preferred embodiment of the present invention.

Reference will now be made to the drawings to describe the present invention in detail.

Referring to FIGS. 1-6, an electrical connector assembly 100 according to the present invention comprises a printed circuit board 4 and a socket connector 1000 mounted onto the printed circuit board 4. The socket connector 1000 comprises an insulating housing 1 having a plurality of terminals (not show) received therein and a clip (not show) mounted to the printed circuit board 4. The clip (not show) includes a cover 2 located above the insulating housing 1 and a plurality of retention members 5 for securing the cover 2 to the printed circuit board 4.

The cover 2 comprises a base portion 20 and a plurality of first, second, third and fourth sidewalls 21, 22, 23, 25 bending downwardly from the base portion 20. The cover 2 also comprises a first tongue portion 24 extending from the first side 21 of the base portion 20. The first tongue portion 24 has a through hole 240. A pair of second tongue portions 27 extending downwardly from the second and third sides 22, 23 of the base portion 20 and opposite to each other. The second tongue portions 27 each has a hole 270 comprising a larger receiving hole 2700 and a smaller retention hole 2701 communicated with each other.

Figure 2:
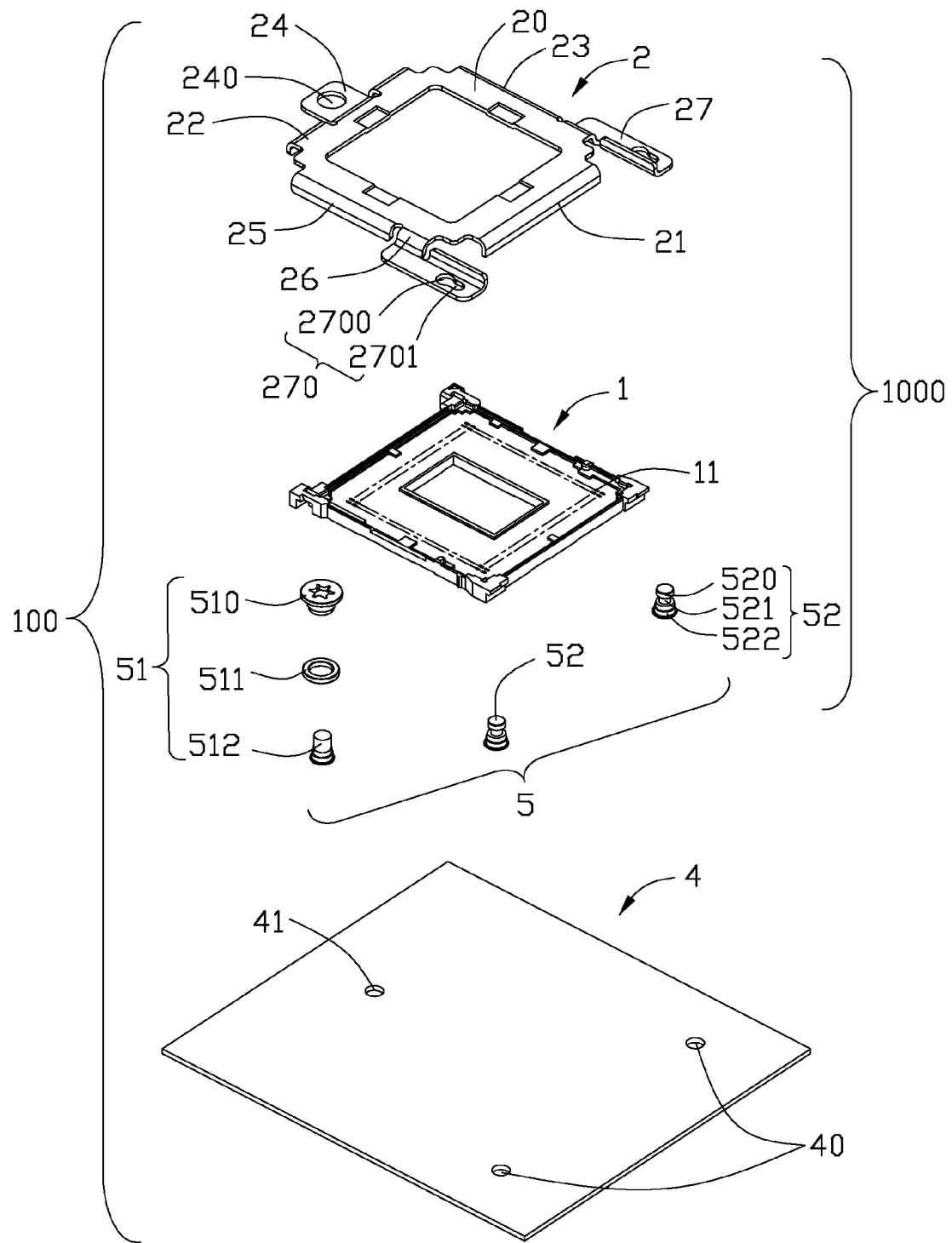
FIG. 2 is an isometric, exploded view of the electrical connector assembly as shown in FIG. 1.
Figure 3:
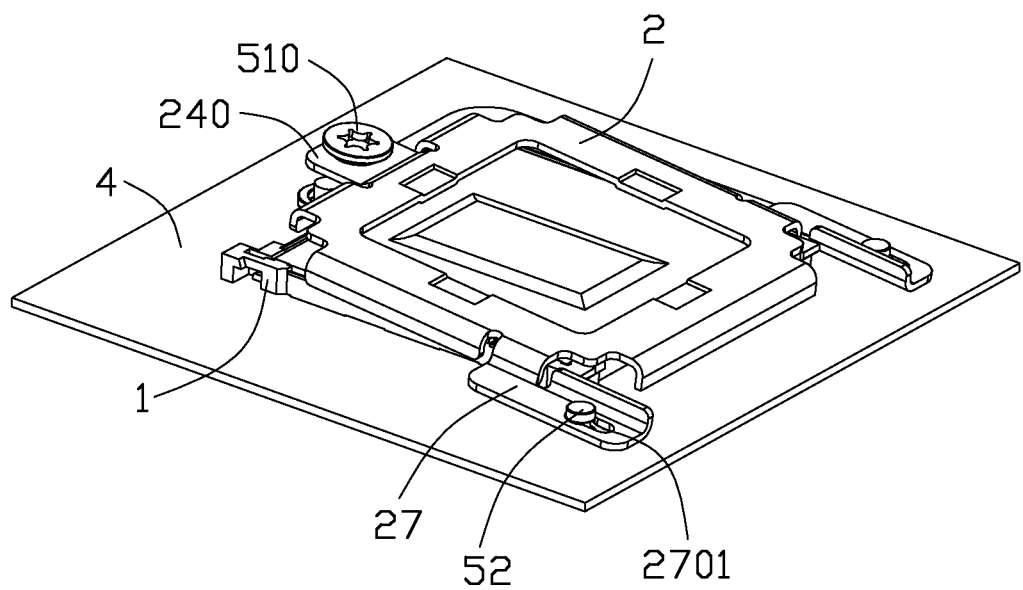
FIG. 3 is an isometric, assembled view of the electrical connector assembly shown in FIG. 1, showing the post located at the through hole.
Figure 4:
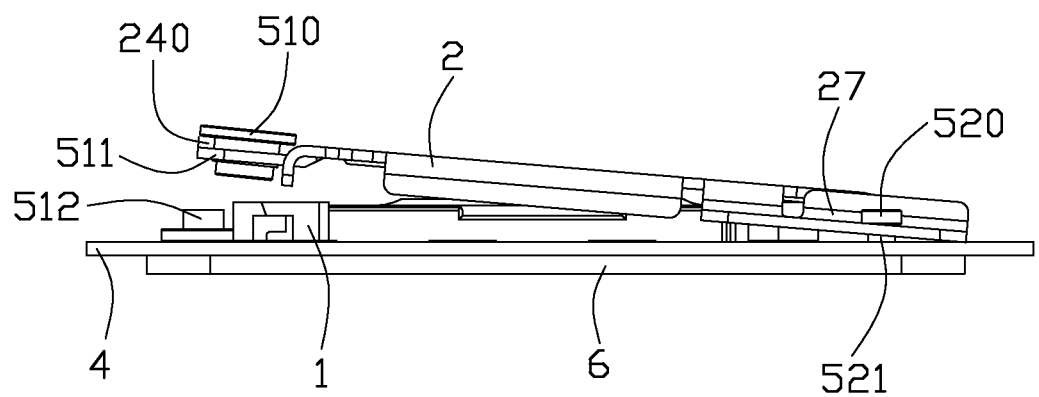
FIG. 4 is a side view of the electrical connector assembly shown in FIG. 3.
Figure 5:
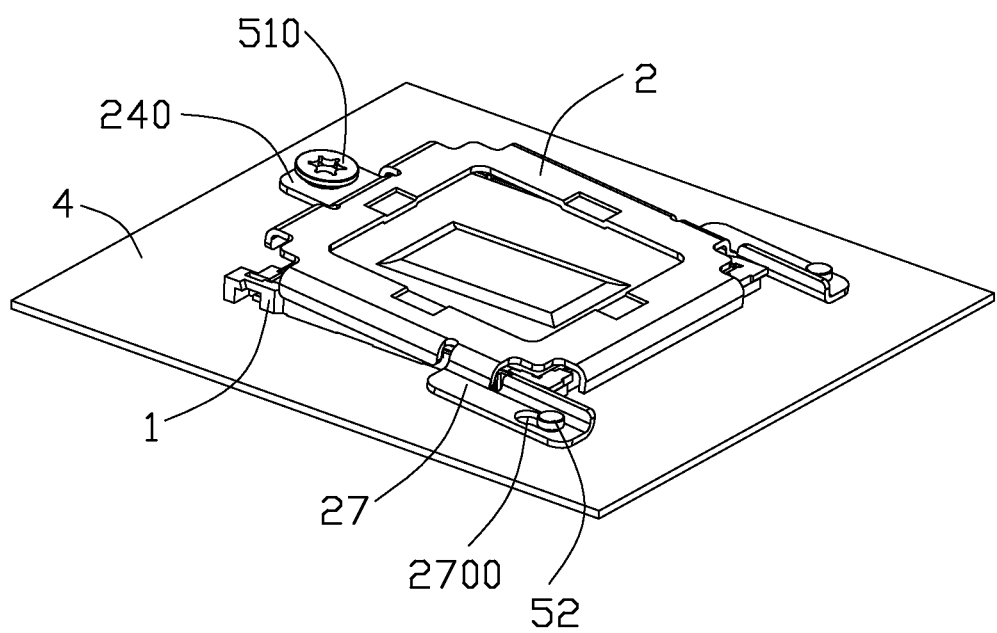
FIG. 5 is an isometric, assembled view of the electrical connector assembly shown in FIG. 1, showing the post located at the retention hole.
Figure 6:
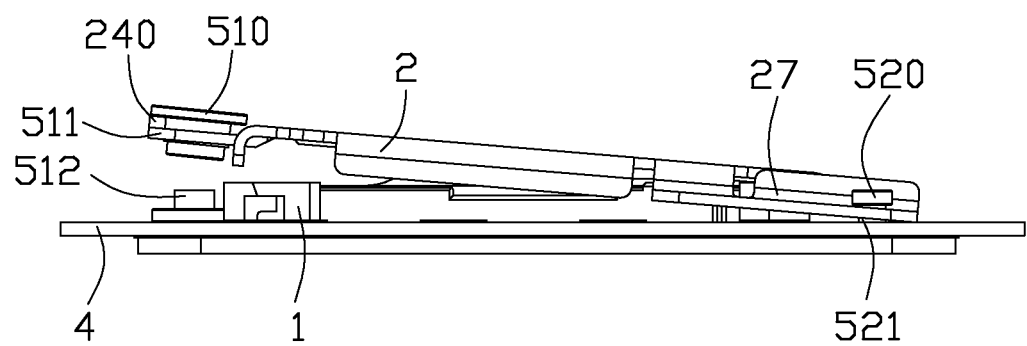
FIG. 6 is a side view of the electrical connector assembly shown in FIG. 5.

Referring to FIG. 2, the retention members 5 comprises a first position member 51 and a pair of second position members 52. The first position member 51 comprises a nut 510, a bolt 512 and a collar 511 arranged/disposed between the nut 510 and the bolt 512. Each second position member 52 comprises a top head 520 and a neck portion 521 located beneath the top head 520 and a bottom head 522 located beneath the neck portion 521. The neck portion 521 is smaller than the top head 520 and the bottom head 522. The diameter of the retention hole 2701 is smaller than the diameter of the top head 520 of the second position members 52 and the diameter of the top head 520 is smaller than the diameter of the through hole 2700.

The printed circuit board 4 has a first through hole 41 for the bolt 512 passing therethrough and two second through holes 40 for the neck portion 521 and the top head 520 of the second position members 52 passing therethrough. A back plate 6 is attached to the a bottom surface of the printed circuit board 4. The retention members 5 are also secured to the back plate 6.

FIGS. 3-6 show an assembled view of the electrical connector assembly 100. When assembled, the insulative housing 1 with the terminals (not show) is soldered to the printed circuit board 4. The retention members 5 are secured to the back plate 6 and the printed circuit board 4 with the top head 520 and the neck portion 521 of the second position members 52 passing through the second through hole 40. The bolt 512 also projects through the first through hole 41. The nut 510 and the collar 511 are assembled to the cover 2 from opposite sides thereof.

Then the cover 2 can be put on the insulative housing 1 with the top head 520 of the second members 52 first aligning with the bigger receiving hole 2700 and then passing therethrough. At this time, the cover 2 is located at a first position. Next, the cover 2 can be pushed to slide horizontally and rotate until the neck portion 521 of the second position members 52 slips/enters into the smaller retention hole 2701 and the top head 520 clips to the second tongue portion 27 so that one end of the cover 2 is mounted to the printed circuit board 4 and the other end of the cover 2 is pressed to move downwardly and rotates so that the nut 510 can be fastened to the bolt 512.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector assembly comprising:
   a printed circuit board; and
   a socket connector assembly comprising an insulating socket having a plurality of terminals received therein, a cover located on the insulating housing and three retention members secured to the printed circuit board and mating with the cover; and
   a chip module seating on the insulative socket and electrically connecting therewith; and wherein
   the cover is attached to two of the retention members and capable of sliding with regarding to said insulating socket horizontally and conducting rotational movement with regarding to said retention members so that the cover presses the chip module toward the socket connector and is secured by another retention member.

2. The electrical connector assembly as claimed in claim 1, wherein the cover first maneuver a horizontal linear movement and a first rotational movement with regard to the insulative socket after attaching to said two retention members.

3. The electrical connector assembly as claimed in claim 2, wherein the cover then has a vertical linear movement and a second rotational movement with regard to the insulative socket, and wherein the first and second rotational movements are towards to opposite directions.

4. The electrical connector assembly as claimed in claim 1, wherein said two of the retention members are located at one end of the cover, and said another retention member is located at the other end of the cover.

5. The electrical connector assembly as claimed in claim 4, wherein said two of retention members each comprise a top head, a necking portion beneath the top head and a bottom head beneath the necking portion, and wherein the cover comprises two holes for mating with the two of the retention member at said one end thereof.

6. The electrical connector assembly as claimed in claim 1, wherein said another retention member comprises a nut located on the printed circuit board and a bolt passing a through hole defined on said the other end of the cover, and the bolt and the nut engage with each other.

7. The electrical connector assembly as claimed in claim 6, wherein said another retention member further comprises a collar attached to the bolt so as to secure the bolt on the cover.

8. The electrical connector assembly as claimed in claim 1, further comprising a back plate located under the printed circuit board, and wherein said retention members further engage with the back plate.

9. A clip for securing a chip module to a socket, comprising:
   a cover comprising a base portion, two first tongue portions bending downwardly from opposite sides of the base portion, and a second tongue extending from a third side of the base portion;
   two first retention members providing two fixed points for the cover, said each of the first tongue portions comprising a first hole and a second hole communicated with the first hole, the diameter of the first hole is bigger than the second hole and being capable of attaching to the first retention members so that the cover attaching to the first retention member at a first position and sliding from the first hole to the second hole with regarding to the first retention member to a second position; and
   a second retention member providing another fixed point for the cover, said cover rotating from the second position to a third position and being secured by the second retention at the third position.

10. The clip as claimed in claim 9, wherein said two tongue portions are located at one end of the cover and the third tongue portion is located at the other end of the cover.

11. The clip as claimed in claim 9, wherein the cover has a rotational movement during sliding from the first position to the second position.

12. The clip as claimed in claim 9, wherein the first tongue portion defines a bigger receiving hole and a smaller retention hole communicated with each other, and the first retention member projects out of the bigger receiving hole at the first position and is restricted by the smaller retention hole at the second position.

13. The clip as claimed in claim 9, wherein the first retention member comprises a top head is bigger than the smaller retention hole and a neck portion smaller than the smaller retention hole.

14. The clip as claimed in claim 9, wherein the second retention member comprises a nut and a bolt, and wherein the nut and bolt can be attached to the second tongue portion from opposite sides thereof and engage with each other.

15. The clip as claimed in claim 14, wherein the second retention member comprises a collar mating with the bolt and securing the bolt on the second tongue portion.

16. An electrical connector assembly comprising:
   a printed circuit board defining a connector mounting area with opposite first and second mounting regions in a front-to-back direction;
   an insulative housing, with a plurality of contacts therein, seated upon the connector mounting area;
   opposite first and second mounting pegs located in the first and second mounting regions, respectively; and
   a metallic cover located upon the housing and defining opposite first and second securing devices in the front-to-back direction corresponding to the first and second mounting pegs, respectively; wherein
   the cover is essentially movable relative to the housing in the front-to-back direction between a first position, where the second securing device is allowed to be upwardly disengaged from the corresponding second mounting peg so as to allow the cover to be disassembled from the printed circuit board and leave away from the housing for loading/unloading a chip module with regard to the housing, and a second position, where the second securing device is engaged with the corresponding second mounting peg and the first securing device is latched with the corresponding first mounting peg so as to lock the cover to the printed circuit board and firmly hold the chip module in the housing.

17. The electrical connector assembly as claimed in claim 16, wherein the cover is adapted to be slightly rotated relative to the housing.

18. The electrical connector assembly as claimed in claim 16, wherein the first securing device and the second securing device are arranged in a triangular manner around the housing.

19. The electrical connector assembly as claimed in claim 18, wherein in said triangular manner the second securing device includes two point and the first securing device includes one.

20. The electrical connector assembly as claimed in claim 19, wherein said two points are respectively located by two sides of the housing in a transverse direction perpendicular to said front-to-back direction.

* * * * *